(12) United States Patent
Yoshida et al.

(10) Patent No.: US 10,039,187 B2
(45) Date of Patent: Jul. 31, 2018

(54) FLEXIBLE PRINTED WIRING SUBSTRATE

(71) Applicant: NTT ELECTRONICS CORPORATION, Yokohama-shi, Kanagawa (JP)

(72) Inventors: Kazumasa Yoshida, Yokohama (JP); Toshiyuki Ozawa, Yokohama (JP); Teruaki Sato, Yokohama (JP); Atsushi Tomita, Yokohama (JP); Yosuke Takeuchi, Yokohama (JP); Shinji Mino, Yokohama (JP); Yusuke Nasu, Yokohama (JP)

(73) Assignee: NTT ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 15/561,457

(22) PCT Filed: Mar. 17, 2016

(86) PCT No.: PCT/JP2016/001568
§ 371 (c)(1),
(2) Date: Sep. 25, 2017

(87) PCT Pub. No.: WO2016/152124
PCT Pub. Date: Sep. 29, 2016

(65) Prior Publication Data
US 2018/0124920 A1    May 3, 2018

(30) Foreign Application Priority Data

Mar. 25, 2015  (JP) ................. 2015-063409

(51) Int. Cl.
*H05K 3/36*    (2006.01)
*H05K 3/40*    (2006.01)
(Continued)

(52) U.S. Cl.
CPC ............. *H05K 1/147* (2013.01); *H05K 1/028* (2013.01); *H05K 1/0237* (2013.01); *H05K 1/115* (2013.01);
(Continued)

(58) Field of Classification Search
CPC .......... H05K 1/11; H05K 1/111; H05K 1/112; H05K 1/113; H05K 1/114; H05K 1/116; H05K 3/4007; H05K 3/361
See application file for complete search history.

(56) References Cited

U.S. PATENT DOCUMENTS

2005/0035443 A1   2/2005  Meyer-Guldner et al.

FOREIGN PATENT DOCUMENTS

JP   2007-048822 A   2/2007
JP   2007-078929 A   3/2007
(Continued)

OTHER PUBLICATIONS

NTT Electronics Corporation, *NTT Electronics (NEL) Announces Industry's First High Performance 100G ROSA Products* (http://www.ntt-electronics.com/new/information/2014/3/100g) Mar. 10, 2014.
(Continued)

*Primary Examiner* — Jeremy C Norris
(74) *Attorney, Agent, or Firm* — Workman Nydegger

(57) ABSTRACT

A flexible substrate having a branch structure in the related art has problems in that: adhesive strength after two bodies are folded and fixed at a bonding region decreases due to an unfolding and opening force at a curve portion and ends of the bonded portions are peeled off and generate gaps; and in a soldering process of the two bodies, the electrodes of one body soldered first are displaced due to reheating in soldering the other body secondly and deteriorate in soldered connection. The present invention provides a new flexible
(Continued)

substrate having a branch structure, including first and second bodies joined together, and having a structure in which one of the bodies can be folded back in a longitudinal direction of the whole flexible substrate. Tip ends of the two bodies are provided with multiple electrodes, and are connected by soldering to approximately corresponding positions on both surfaces of an end portion of a printed substrate concerned.

19 Claims, 16 Drawing Sheets

(51) Int. Cl.
  *H05K 1/14* (2006.01)
  *H05K 1/02* (2006.01)
  *H05K 1/11* (2006.01)

(52) U.S. Cl.
  CPC .............. *H05K 2201/09027* (2013.01); *H05K 2201/10189* (2013.01)

(56) References Cited

FOREIGN PATENT DOCUMENTS

| | | |
|---|---|---|
| JP | 2008-077040 A | 4/2008 |
| JP | 2008-294151 A | 12/2008 |
| JP | 2008-311349 A | 12/2008 |
| JP | 2009-188127 A | 8/2009 |
| JP | 2010-200234 A | 9/2010 |
| JP | 2014-013799 A | 1/2014 |
| JP | 2014-207330 A | 10/2014 |
| JP | 2015-038915 A | 2/2015 |

OTHER PUBLICATIONS

NTT Electronics (NEL) announces Industry's Fist High Performance 100G ROSA products (http://www.ntt-electronic.com/new/information/2014/3/100g.
Office Action dated Dec. 1, 2015, issued in Japanese Application No. JP 20150963409.
Office Action dated Jun. 14, 2016 issued in Japanese Application No. JP2015063409.
International Preliminary Report on Patentability dated Oct. 5, 2017, issued in PCT Application No. PCT/JP2016/001568, filed Mar. 17, 2016.

FLEXIBLE PRINTED WIRING SUBSTRATE

TECHNICAL FIELD

The present invention relates to a connection structure and a connection method for electrically connecting substrates on which electronic circuits, optical circuits and the like are mounted. More specifically, the present invention relates to a flexible printed wiring substrate which is made of a flexible material and which connects various circuit substrates.

BACKGROUND ART

As important components in the field of optical communication, optical transmission modules having basic functions such as electro-optic conversion, photoelectric conversion, amplification, reproduction, and modulation/demodulation are used in a wide range of applications. With the background of speed-up and a capacity increase of wired networks and wireless networks, the optical transmission modules are required to perform signal processing at higher speed, and are strongly required at the same time to achieve cost reduction and enhancement of reliability. The optical transmission module achieves high speed signal transmission by using a flexible printed wiring substrate to electrically connect a substrate on which optical semiconductor elements (such as a semiconductor laser, a light receiving element, and a modulation element) are mounted, and a substrate on which signal generator circuits (such as a driver circuit and an amplifier circuit) are mounted.

The optical transmission modules which establish connection by using flexible printed wiring substrates have been advancing in downsizing of their packages, speed-up of electric signals, and an increase in the number of arrays in their internal structures. One of known examples of such latest optical transmission modules advanced in downsizing and speed-up is a receiver module of pluggable optical transceiver (ROSA: Receiver Optical Sub-Assembly) as described in Non-Patent Document 1. For example, in the latest downsized 100 Gb/s ROSA module, electric signal wires for four channels having a transmission rate of 25 Gb/s and a large number of DC bias lines are formed on a package with a width of 7.0 mm. In the case of constructing input/output wires on one side of the package, it is necessary to connect the inside of the module to an outside by the electric signal wires and the power supply wires within a range of the one side having a width of 7.0 mm, for example.

A flexible printed wiring substrate (FPC: Flexible Printed Circuit) is made of a material thinner and more flexible than that for an ordinary printed wiring substrate, and is provided with a conductor foil formed using a film-form insulator as a base, for example. A flexible printed wiring substrate is connected to a circuit substrate or the like in such a way that the electrodes at the tip end portions of the signal wiring patterns formed on the respective substrates are fixed to each other by soldering. In the following description, the flexible printed wiring substrate is simply referred to as a "flexible substrate".

As a mounting method of fixing electronic components or the like on a substrate by soldering, a method is widely known in which chip components of a surface mount type are fixed in an almost-completely automated manufacturing process using a screen-printed cream solder and a reflow furnace. For components with special shapes or sizes, components with limited heat resistance, or the like, there is a method of mounting the components, for example, by applying a solder to the printed substrate, and then performing an instantaneous heating method using a hot bar (heater tip). In addition, there is also known a mounting method in which a solder on a substrate is preliminarily reflowed and melted, and then is re-reflowed by an instantaneous heating method (Patent Literature 1).

In the case of connecting the 100 Gb/s ROSA module described above by using a flexible substrate, it is necessary to form a large number of wires and connection terminals of the respective wires within a very narrow width of 7 mm on one side of the package of the module, and to form corresponding connection terminals on the flexible substrate. If the numbers of signal wires and power supply wires are increased, a situation may occur in which a single flexible substrate cannot connect all the wires.

CITATION LIST

Non Patent Literature

NPL 1: URL http://www.ntt-electronics.com/new/information/2014/3/100g-apd-rosa.html

Patent Literature

PTL 1: Japanese Patent Laid-Open No. 2008-311349

SUMMARY OF INVENTION

Technical Problem

FIGS. 1A and 1B are views for explaining a structure of a flexible substrate in the related art and a method of connecting the flexible substrate and a package. FIG. 1A is a view of the structure of the flexible substrate. As illustrated in FIG. 1A, a flexible substrate 1 includes a connector 3 at one end thereof, and multiple connection electrodes 2 on the opposite end thereof. The connection electrodes 2 are to be connected by soldering to electrodes on a package of an optical transmission module. As described above, a body of the flexible substrate is provided with a conductor foil formed using a film-form insulator as a base. Thus, although having a limitation in the radius of curvature in folding, the flexible substrate can be folded and curved within the above range. The body of the flexible substrate is not limited to a rectangular body as illustrated in FIG. 1A, but may have any of various shapes according to the form of connection with the optical transmission module. In FIG. 1A, through holes are formed in each of the multiple electrodes 2 in order to improve solderability. Thus, electrodes of the same shape are also provided on the surface opposite to the surface seen in FIG. 1A, and the solder spreads over both surfaces via the through holes. The through holes are not indispensable. However, if there is a demand for high reliability in an optical transmission module or the like, it is desirable to provide the through holes in order to improve the reliability of the soldered portions.

In the above-mentioned ROSA module, if the number of electric signal wires is increased while the package is downsized, one flexible substrate cannot cover all the electric signal wires. In this case, electric connection between the inside and outside of the optical transmission module needs to be established by using two flexible substrates.

FIG. 1B is a side view of an optical transmission module to which two flexible substrates are connected. Two flexible substrates 12, 13 are soldered to conductor layers 16, 17 on both surfaces of a terrace-like substrate 11 jutting from an optical transmission module 10 by solder pieces 14, 15. Each of the two flexible substrates 12, 13 has a structure as illustrated in FIG. 1A, and the structure illustrated in FIG. 1B can be obtained by soldering the multiple connection electrodes 2 of the two flexible substrates one after another to the conductor layers 16, 17 on both surfaces of the terrace-like substrate 11. Although a soldering process is not described in details herein, it is possible to use a method in which a solder is applied to the electrodes on both surfaces of the substrate 11 and the flexible substrates are mounted one by one on the electrodes of the front and back surfaces of the substrate 11 in the instant heating method using a hot bar (heater tip), or to use a manual soldering method or the like.

In the case of constructing a structure as illustrated in FIG. 1B using two flexible substrates, the number of connectors increases according to the number of flexible substrates. In addition to this, the electrode connection by soldering takes place at two places on both surfaces of the substrate 11, which makes the structure complicated, and the mounting process complicated as well. To address to this problem, it is possible to use a flexible substrate having a branch structure including one connector and two branched bodies.

FIGS. 2A to 2C are views for explaining a structure of a flexible substrate having a branch structure in the related art. FIG. 2A is a view of an unfolded state of the structure of the flexible substrate having the branch structure. FIG. 2B is a view of a state where the flexible substrate having the branch structure is folded up in order to be mounted on a printed substrate. FIG. 2C is a view of a cross section of the folded-up flexible substrate taken along IIC-IIC' line and seen from the connector side. In all the views, the printed substrate to which this flexible substrate is to be connected by soldering is not illustrated.

As illustrated in FIG. 2A, the flexible substrate having the branch structure in the related art includes a connector 23 provided on one end thereof, and equipped with pins for connection, and a body 21 of the flexible substrate is connected with the connector 23. As similar to the flexible substrate illustrated in FIG. 1A, the body 21 is provided with a conductor foil formed using a film-form insulator as a base. A second body 22 includes a branch portion 22b and an overlap portion 22a which can be overlapped with the body 21 when folded up, and therefore has an approximately-L shape. Specifically, the second body 22 includes the branch portion 22b which is formed to branch approximately perpendicularly from an intermediate part of the body 21 and extend continuously from the body 21, and the overlap portion 22a which is bent at 90 degrees continuously from the branch portion 22b, is parallel to the body 21, and can be overlapped with the body 21 when folded up. The two bodies 21, 22 include multiple electrode parts 29, 28a, respectively, on their ends on the side opposite to the connector 23. An inside (internal layer) of each of the two bodies 21, 22 is provided with wiring, a GND portion, and the like which are formed of a conductor, and which electrically connect the connection pins of the connector 23 to the terminals of the multiple electrode parts 29 or 28a to be soldered. A bonding region 25 is provided at a place on the body 21 from which the second body 22 is branched, and an epoxy-based adhesive is applied to or a double-sided tape is attached to the bonding region 25.

FIG. 2B is a view of a state where, of the two bodies having the branch structure in the unfolded state illustrated in FIG. 2A, the second body 22 is folded back from the right side to the left front side in the drawing to have a positional relationship in which the multiple electrodes 29, 28b of the two bodies are placed on top of each other. Thus, the back surface of the second body 22 not viewable in the unfolded state illustrated in FIG. 2A appears in FIG. 2B. As for the multiple electrodes 28a at the tip end of the second body 22 in the unfolded state illustrated in FIG. 2A, electrodes 28b on the back surface are viewed in the folded-up state in FIG. 2B. The second body 22 is folded up at an intermediate part in the branch portion 22b perpendicularly branched from the body 21 while forming a mild curve portion 24 so as to prevent a crack, damage, or the like from occurring in the flexible substrate. The second body 22 needs to be folded with a radius of curvature of the curve portion 24 kept at about 0.6 to 3.0 mm, for example. FIG. 2C is a view of a cross section taken along the IIC-IIC' line in FIG. 2B and seen from the connector 23 side. The curve portion 24 has an approximately circular shape, and the body 21 and the second body 22 in the folded-up state are fixed to each other at the bonding region 25. The bonding region 25 is filled with a material for an adhesive or double-sided tape. The substrate 11 of the optical transmission module is nipped between the tip end portions of the two bodies in the folded-up state, although not illustrated in FIG. 2B.

As compared with the case of using the two flexible substrates with the simple shapes as illustrated in FIG. 1A, the flexible substrate having the branch structure in the related art illustrated in FIGS. 2A to 2C is just one flexible substrate and therefore is advantageous from the viewpoints of cost and handling. However, the flexible substrate requires a process of folding up one of the two bodies and fixing them in the form as illustrated in FIG. 2C.

For the case of fixing a flexible substrate having a branch structure in the form as illustrated in FIGS. 2A to 2C, there have been problems to be solved to achieve further downsizing, and ensure the shape controllability and reliability of the fixation arrangement. The insulator used as the base of the flexible substrate is relatively flexible, but is required to improve the reliability in withstanding heat in soldering of the flexible substrate and stress due to folding of the flexible substrate. To this end, both surfaces of a flexible substrate are provided with coverlay layers (films) of a polyimide which is a material having considerable stiffness. Since this relatively stiff polyimide is also used as a substrate material for the flexible substrate, the flexible substrate exerts a strong unfolding and opening force due to its stiffness when folded up. For example, when the facing surfaces of the body 21 and the second body 22 in FIG. 2B are bonded by a double-sided tape, the adhesive strength of the adhesive of the double-sided tape gradually decreases as the flexible substrate is left in a high-temperature and high-humidity environment for a long time.

FIG. 3 is a view for explaining deterioration in a bonded portion of the flexible substrate having the branch structure in the related art. The upper drawing in FIG. 3 presents a state where the two bodies are folded up and fixedly bonded at the bonding region 25. Immediately after the fixation is done at the bonding region 25, the curve portion 24 keeps an initial cross sectional shape at the fixation, that is, an approximately circular shape. However, when the adhesive strength deteriorates due to an unfolding and opening force exerted in the curve portion 24, an end portion of the double-sided tape is peeled off to generate gaps 26 as illustrated in an enlarged lower drawing in FIG. 3. As the adhesion state in the bonding region 25 is further loosened, the gaps 26 are opened, so that the curve portion 24 in the folded-up structure expands beyond a predetermined range. In a situation where components are packaged at high density, there is a risk that the flexible substrate around the curve portion 24 may be in contact with surrounding components for a long time, and damage the components.

In an optical transmission module required to achieve downsizing and high-density packaging as in a 100 Gb/s ROSA module, it is necessary to make the space around the flexible substrate as small as possible. In order to avoid interference of the flexible substrate with surrounding components, the flexible substrate has to be strongly bonded and fixed so that the folded-up and fixed flexible substrate may not open. Furthermore, only simply folding the branched body is insufficient, and the flexible substrate is also required to be capable of controlling the space shape formed by the curve portion after the folding-up such that the flexible substrate may not hit surrounding components.

Further, the flexible substrate having the branch structure in the related art illustrated in FIGS. 2A to 2C also pose other problems in soldering of the two bodies 21, 22 of the flexible substrate to the optical transmission module. In addition to the long-term reliability problem mentioned above, there occur problems of deterioration in soldering quality and displacement of electrodes of the flexible substrate in the soldering process. Also in the case of the flexible substrate having the branch structure in the related art illustrated in FIGS. 2A to 2C, the two bodies 21, 22 are soldered to the conductor layers on both surfaces of the terrace-like substrate of the optical transmission module 10 by a solder as illustrated in FIG. 1B. The multiple electrodes 29, 28a are provided at the tip end portions of the two bodies 21, 22, respectively. Thus, in the same manner as illustrated in FIG. 1A, the multiple connection electrodes of each of the bodies are soldered to the corresponding one of the conductor layers 16, 17 on both surfaces of the terrace-like substrate 11.

In this soldering process, the multiple electrodes of one of the bodies are first soldered to the electrodes on one of the surfaces of the terrace-like substrate 11. Then, the multiple electrodes of the other body are soldered to the electrodes on the opposite surface of the terrace-like substrate 11. For example, after the electrodes 29 of the first body 21 in FIG. 2A are soldered to one of the surfaces of the terrace-like substrate 11 (step 1), the optical transmission module is turned upside down and positioned (step 2), and then the electrodes 28a of the second body 22 are soldered to the opposite surface of the terrace-like substrate (step 3). In the above two soldering steps, certain jigs for soldering work are used to position the electrodes.

In the aforementioned first soldering of the body 21 (step 1), the positioning and the soldering work can be performed relatively easily because the second body 22 is not yet fixed and no physical constraint is imposed in the soldering work. Since the soldering work is usually performed in a state where the target surface of the substrate to be soldered is set on the upper side, the aforementioned work of turning the optical transmission module upside down (step 2) is necessary. In other words, before the second soldering of the body (step 3) is performed, its preparation step is necessary. Specifically, in the state where the first body 21 is fixed to the one surface of the substrate of the module after the soldering is completed, it is necessary to reverse the whole module, and then to align the second body with the electrodes on the opposite surface of the substrate 11 by unsharply folding the second body of the stiff flexible substrate (step 2). In this series of steps 2 and 3, considerable stress is applied to the electrodes of the first body 21 already soldered in the first step 1 and the joint portion (solder). In the folding work of the flexible substrate having the branch structure as illustrated in FIG. 2A, in particular, stress is highly likely to be applied in a transverse direction 30 which is a branching direction of the second body and is also an array direction of the multiple electrodes 29, 28a, 28b. This array direction 30 of the multiple electrodes is usually a short-side direction (widthwise direction) of each of the electrodes. Accordingly, the stress applied in the short-side direction of the electrodes is applied in a concentrated manner especially to the electrode and the soldered portion on the side closest to the folded-back portion (the curve portion) 24.

The flexible substrate is provided with the coverlay layers (films) as described above. For this reason, even when unsharply folded to perform the soldering work of the second body 22, the flexible substrate exerts an unfolding and opening force (stress) due to its stiffness. In this work, the already-soldered joint portion of the first body is loaded with stress of peeling off the joint portion. This peel stress is also continuously applied all the time during the soldering work on the second body (step 3). In step 3, when the electrodes 28a, 28b are heated together with the substrate 11 in order to solder the second body 22, the first body 21 already soldered is also reheated simultaneously. This reheating may deform or damage the soldered joint portion once fixed or allow the electrodes to be displaced due to the peel stress, with the result that the solder of the first body 21 may come off in the worst case. Such problems due to the peel stress are serious on the electrodes on the side close to the curve portion 24 of the folded-back second body.

The aforementioned peel stress is applied in the branching direction of the second body 22, that is, the array direction 30 of the multiple electrodes illustrated in FIG. 2A, and is applied in the short-side direction of each electrode in which the electrode is more vulnerable to the stress. Usually, the first body 21 soldered first (step 1) is used mainly for wiring for high-frequency signals. This is because, in order to reduce a loss of the high-frequency signals by surly melting the solder and performing the soldering, such a body has to be mounted first at a higher temperature. The displacement of the electrodes on the soldered joint portion already fixed or the deformation or damage of the joint portion which occurs during the reheating in the second soldering work (step 3) may result in deterioration in the transmission characteristics of the high-frequency signals via the flexible substrate. For example, electrodes for high-frequency signal have a repeating distance (pitch) of about 500 µm and a width electrode of about 200 µm. Hence, if the position to which the electrode is connected is displaced by even only about 50 µm, a loss of the high-frequency signal occurs.

The displacement of the electrodes or the deformation or damage of the joint portion which occurs in the second soldering work involving reheating the substrate deteriorates high-frequency characteristics, and consequently causes a problem of a decrease in the yield of optical transmission modules.

The present invention has been made in view of the foregoing problems, and has an object to propose a structure with which a flexible substrate having a branch structure can attain a highly-reliable and stable folded-up structure. Moreover, another object thereof is to provide a flexible substrate which is capable of preventing displacement of electrodes on a soldered joint portion or a deformation or damage of the joint portion, which otherwise may occur in mounting work of the flexible substrate.

Solution to Problem

In order to achieve such objects, a first aspect of the present invention provides a flexible substrate having a branch structure, the flexible substrate including: a connector; a first body containing first electric wiring connected to the connector, and including a plurality of solderable first electrodes; and a second body containing second electric wiring connected to the connector, and including at least one side portion which extends from the connector in a first direction being a longitudinal direction of the flexible substrate, and a transverse side portion which extends from the at least one side portion in a second direction being approximately perpendicular to the first direction, and which includes a plurality of solderable second electrodes, the second body formed in a band-like form to surround the first body. The first body and the second body are joined together at least in or near a region to which the connector is connected, and a formation region of the plurality of first electrodes and a formation region of the plurality of second electrodes are located at approximately the same positions in the second direction.

Preferably, the first body may have an approximately rectangular shape, and either the second body may include two side portions extending approximately in parallel along the first direction, and a transverse side portion extending from the two side portions, and have an approximately squared-U or U shape to surround three sides of the rectangular shape, or the second body may include one side portion extending along the first direction, and a transverse side portion extending from the one side portion, and have an approximately L shape to surround two sides of the rectangular shape.

More preferably, at least one of two end portions of the transverse side portion may include a part that fixes a position of the plurality of second electrodes of the second body relative to the first body.

Moreover, when the transverse side portion of the second body is folded in the first direction, the formation region of the plurality of first electrodes and the formation region of the plurality of second electrodes may be located on top of each other.

Even more preferably, the first electric wiring may be high-frequency electric signal wiring, and the second electric wiring may be power supply wiring.

Furthermore, each of the plurality of first electrodes and the plurality of second electrodes may include a through hole or a blind hole.

Advantageous Effects of Invention

As described above, according to the flexible substrate having the branch structure in the present invention, it is possible to form a compact folded-up structure with high reliability in bodies of a branched flexible substrate, and further to reduce the occurrence of displacement of electrodes and a deformation or damage of the joint portion in a soldering process. The flexible substrate in the present invention is effective to advance downsizing and high-density packaging of optical transmission modules, and to prevent deterioration of high-frequency characteristics and a decrease in the yield of optical transmission modules.

DESCRIPTION OF EMBODIMENTS

The present invention provides a flexible substrate having a branch structure. The flexible substrate in the present invention includes a first body and a second body joined to each other, and one of the bodies has a structure that can be folded back in a longitudinal direction of the whole flexible substrate. Tip ends of the two bodies are each provided with multiple electrodes. The multiple electrodes are connected by soldering to approximately corresponding positions on both surfaces of an end portion of a printed substrate concerned. The flexible substrate is structured such that the peel stress due to the folding-back is applied to the multiple electrodes on the tip ends of the two bodies along the longitudinal sides of each electrode. The flexible substrate having the branch structure in the present invention is effective to advance downsizing and high-density packaging of optical transmission modules, and to achieve high reliability of soldered joint portions. Hereinafter, various embodiments of the present invention will be described with reference to the drawings.

Embodiment 1

Figure 4A:
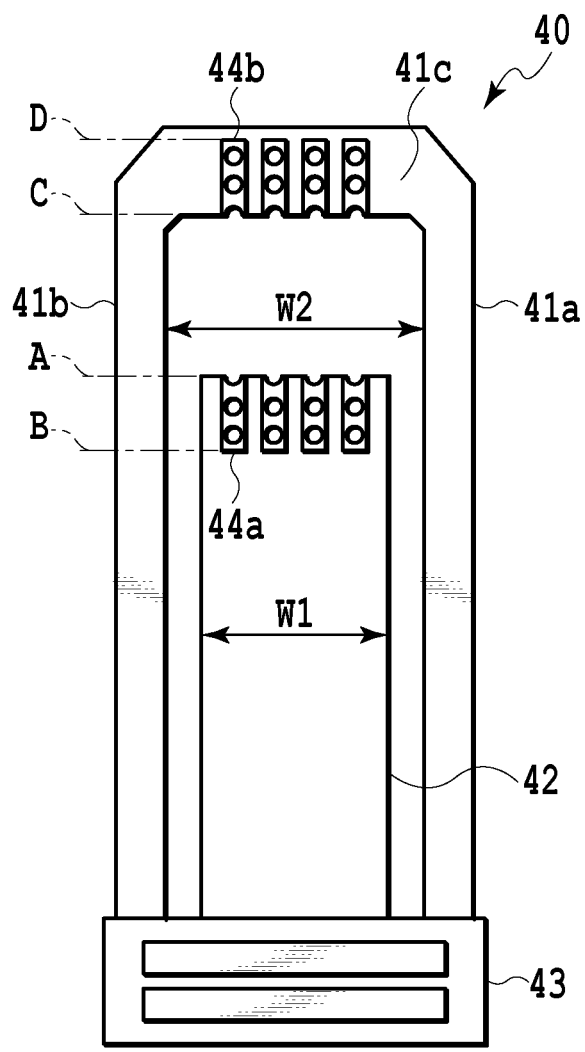
FIG. 4A is a view of a structure in an unfolded state of a flexible substrate in Embodiment 1 of the present invention.
Figure 4B:
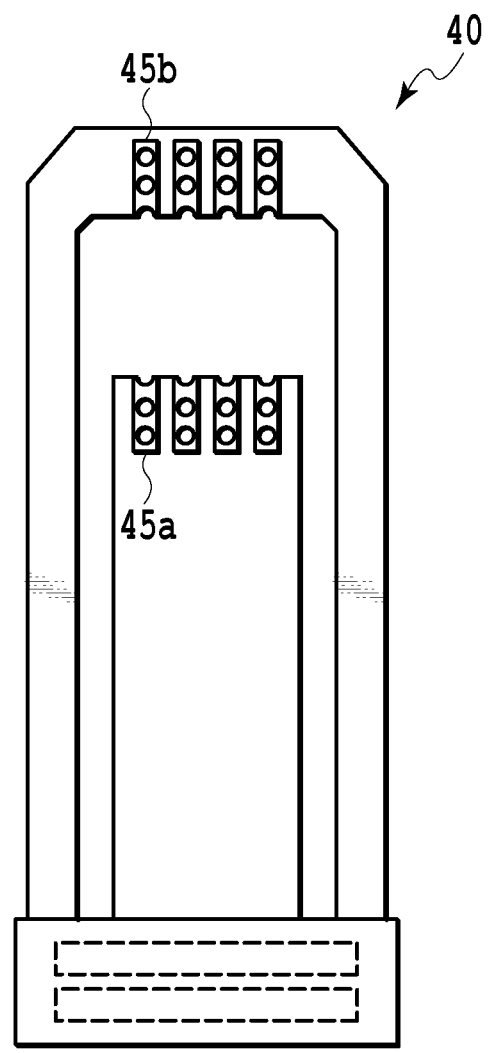
FIG. 4B is a view of a structure on the opposite side of the flexible substrate in Embodiment 1 of the present invention.

FIGS. 4A and 4B are views illustrating a structure of an unfolded state of a flexible substrate in Embodiment 1 of the present invention. FIG. 4A is a view of a side of the flexible substrate on which solder joint surfaces and pins of a connector are seen, whereas FIG. 4B is a view of the side opposite to FIG. 4A. A flexible substrate 40 includes a connector 43 at one end thereof, the connector 43 equipped with multiple pins for connection. A first body 42 and a second body of the flexible substrate are connected with the connector 43. The second body includes three side portions (41a, 41b, 41c) and is in a band-like form in an approximately squared-U or U shape, as will be described later.

Figure 1A:
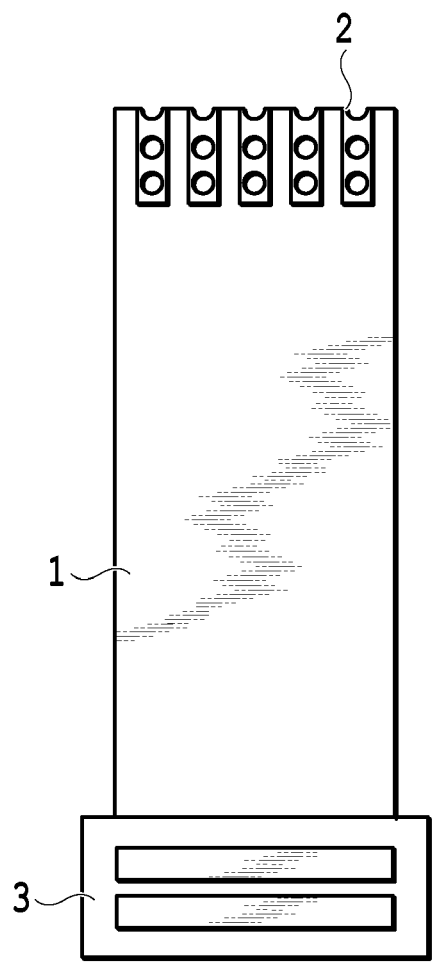
FIG. 1A is a view for explaining a structure of a flexible substrate in the related art.
Figure 1B:
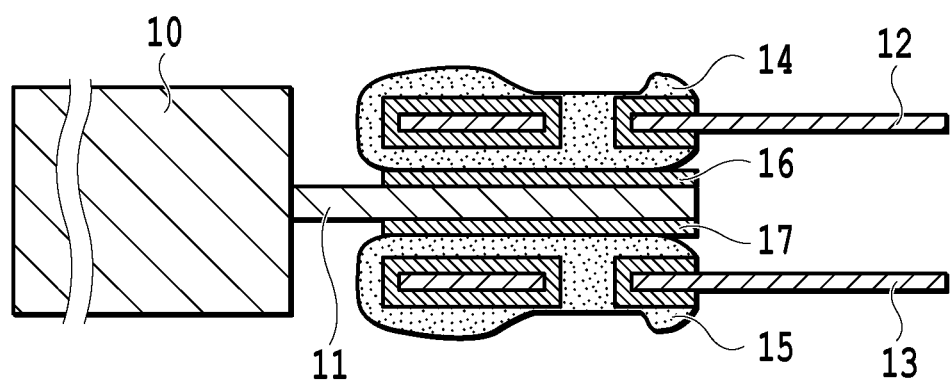
FIG. 1B is a view for explaining a method of connecting the flexible substrate in the related art to a package.
Figure 2A:
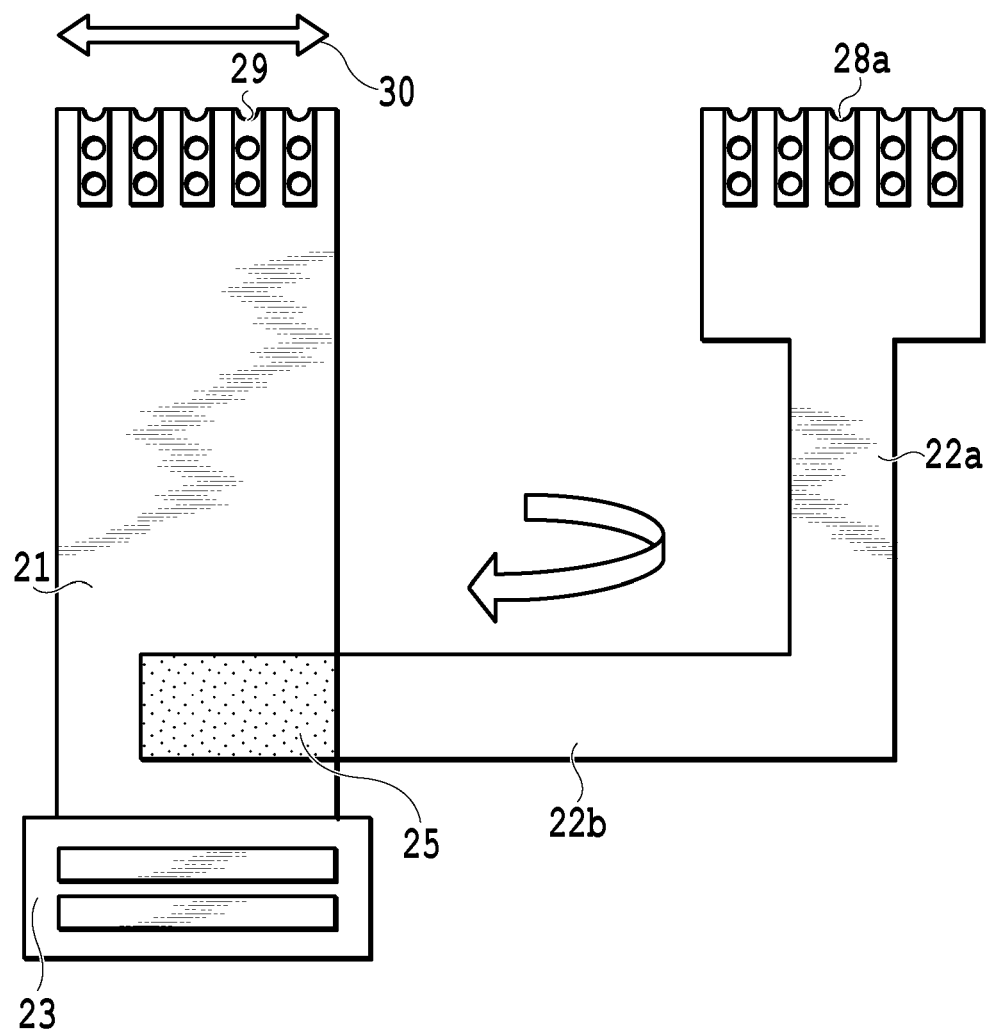
FIG. 2A is a view for explaining a structure of a flexible substrate having a branch structure in the related art.

Both the first body 42 and the second body 41 are provided with a conductor foil formed using a film-form insulator as a base, as in the flexible substrates illustrated in FIGS. 1A and 2A. Although not illustrated in FIGS. 4A and 4B, the first body 42 and the second body 41 are joined to each other in the connector 43, and can be formed as a single body in a state where the connector 43 is detached.

The flexible substrate in the present invention can be also regarded as a flexible substrate having a branch structure like the flexible substrate in the related art illustrated in FIG. 2A. It should be noted that the form of blanching is greatly different from that of the flexible substrate in the related art. Specifically, in the flexible substrate in the related art, the second body is branched, at an intermediate portion of the main body, in the direction perpendicular to the longitudinal direction of the whole flexible substrate. The direction in which the flexible substrate is folded back is the direction perpendicular to the longitudinal direction of the whole flexible substrate. In contrast, in the flexible substrate in the present invention, the two bodies are branched out from a common portion (joint portion) in or near the connector in the longitudinal direction of the whole flexible substrate. Thus, the direction in which the flexible substrate is folded back is the same as the longitudinal direction of the whole flexible substrate. The structure of the flexible substrate in the present invention will be described below in more details based on FIG. 4A.

The first body 42 has an approximately rectangular shape with a width W1, and is formed to be surrounded by the second body 41 and the connector 43 in an unfolded state. The second body 41 is in a band-like form including the three side portions (41a, 41b, 41c) surrounding the first body 42, and has an approximately squared-U or U shape. In other words, the second body 41 has a shape in which the second body 41 surrounds the first body 42 from three sides together with the connector 43. A width W2 of the inner space of the second body 41 and the width W1 of the first body have a relationship of W1<W2. A formation region of the first body 42 at least partly overlaps with the smallest rectangular region including a formation region of the second body 41.

The first body 42 is provided with multiple electrode parts 44a at one end thereof on the side opposite to the connector 43. Here, A and B denote the positions of ends of the electrodes in the longitudinal direction (lengthwise direction) of the whole flexible substrate. The second body 41 includes two side portions 41a, 41b parallel to the longitudinal direction, and a transverse side portion 41c provided on the side opposite to the connector 43 and located farthest from the connector 43. Multiple electrode parts 44b are provided on the transverse side portion 41c, and C and D denote the positions of ends of the electrodes in the longitudinal direction (lengthwise direction). As will be described later, it should be noted that the electrode orientation of the electrode parts 44a is reversed to the electrode orientation of the electrode parts 44b in the vertical direction. To be more precise, in the process of mounting the flexible substrate on the substrate of the optical transmission module, the transverse side portion 41c of the second body is folded back toward the connector 43. Thus, in the state where the second body is folded back, the electrode ends at the position A are aligned with the electrode ends at the position of the line C, whereas the electrode ends at the position B are aligned with the electrode ends at the position D. In FIG. 4A, the lines A and C indicate body ends of the multiple electrodes in a longitudinal direction of each of the multiple electrodes. Each of the electrodes includes any of through holes and blind holes formed in an electrode region.

FIG. 4B is a view of the flexible substrate of the present embodiment viewed from the opposite side to (back side of) the side in FIG. 4A, and is the same view as FIG. 4A except that the pins of the connector 43 are not visible (the pin array portions are drawn by dotted lines). In the structural example illustrated in FIGS. 4A and 4B, the flexible substrate as a whole has a structure symmetric in the right-left direction, and has the same structure on the front and back sides. However, if a flexible substrate has a structure asymmetric in the right-left direction, FIG. 4B illustrates a shape in which the left and right sides in the drawing of FIG. 4A are reversed, as a matter of course. In this way, there may be a case where any of the first body 42 and the second body 41 has a shape asymmetric in the right-left direction. In addition, the two bodies do not have to include the same number of the multiple electrodes 44a, 44b. Meanwhile, the numbers of the electrodes 44a, 45a, the front and back sides of which are connected via the through holes, are the same. The same applies to the electrodes 44b, 45b.

The two side portions 41a, 41b of the second body 41 parallel to the longitudinal direction may have such a length that, when the transverse side portion 41c is unsharply folded back toward the connector 43, the two sets of the multiple electrodes 44a, 44b can be placed on top of each other while sandwiching the printed substrate to be soldered. An inside (internal layer) of each of the two bodies 41, 42 including the film-form insulator as the base is provided with electric wiring, a GND portion and the like which are formed of a conductor, and which electrically connect the connection pins of the connector 43 to the terminals of the multiple electrode parts 44a or 44b to be soldered. In the flexible substrate in the present invention, the two bodies are not bonded or fixed together by using a double-sided tape or the like as in the flexible substrate in the related art having the branch in the transverse direction illustrated in FIG. 2A. Next, description will be provided for a structure in a state where the flexible substrate in the present invention is mounted on a printed substrate, a terrace-like substrate of an optical transmission module, or the like.

Figure 5:
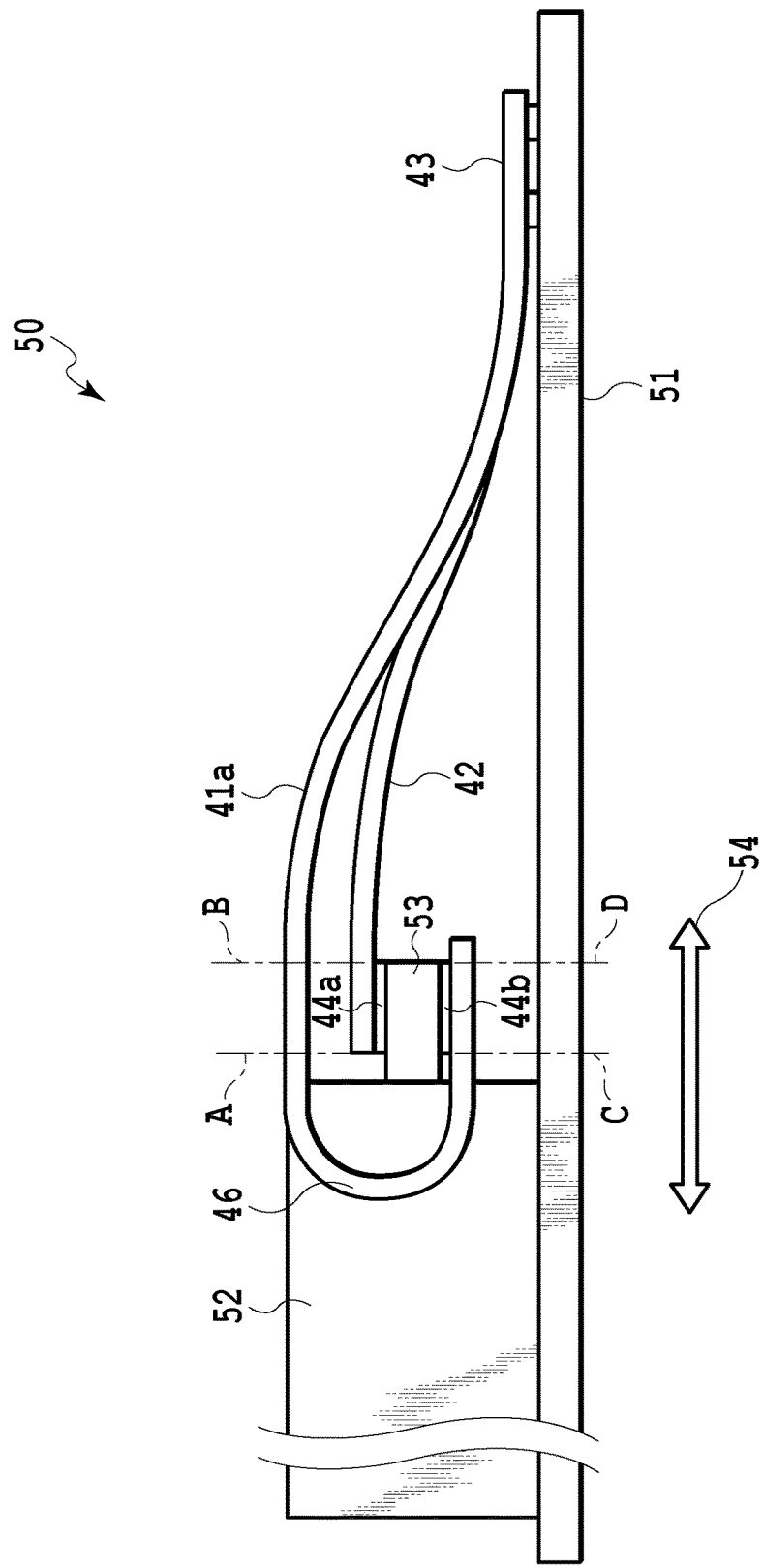
FIG. 5 is a side view of a state in which the flexible substrate in the present invention is mounted on an optical transmission module.

FIG. 5 is a side view of a state where the flexible substrate in Embodiment 1 of the present invention is mounted on the optical transmission module. FIG. 5 is a left side view of a state where the flexible substrate in the present invention illustrated in FIGS. 4A and 4B is mounted on a device substrate. Presented is a state where the first body 42 and the second body 41 are soldered to both surfaces of a terrace-like substrate 53 jutting from a side surface of an optical transmission module 52. Moreover, presented is a state where the optical transmission module 52 is attached on top of a printed substrate 51 of a device, and the connector 43 of the flexible substrate is also connected to the printed substrate 51 of the device. Here, it should be noted that a process of soldering the two bodies of the flexible substrate to the terrace-like substrate 53 of the optical transmission module is performed before the optical transmission module is attached to the device substrate (printed substrate) 51.

The first body 42 of the flexible substrate is soldered to the upper surface of the terrace-like substrate 53 in the drawing with the electrodes 44a interposed in between. On the other hand, in the second body 41 (41a, 41b, 41c), the two side portions 41a, 41b parallel to the longitudinal direction of the flexible substrate viewed on the whole form a unsharply-folded corner portion 46 by turning around a periphery of the terrace-like substrate 53 of the optical transmission module 52. Moreover, the two side portions 41a, 41b are shaped such that the electrodes 44b on the transverse side portion 41c of the second body face the lower surface of the terrace-like substrate 53. In order to fold back the second body 41 in the foregoing manner, the width W2 of the inner space of the second body (here, see in FIG. 4A again) needs to be wider than a width Wm of the optical transmission module. Thus, the width Wm of the optical transmission module (terrace-like substrate) and the widths W1, W2 of the flexible substrate just have to be set to satisfy a relationship defined by W1<Wm<W2, principally.

Therefore, a flexible substrate in the present invention can be configured as a flexible substrate (40) having a branch structure, the flexible substrate characterized by including: a connector (43), a first body (42) which contains first electric wiring connected to the connector and which includes multiple solderable first electrodes (44a); and a second body which contains second electric wiring connected to the connector, and which includes at least one side portion (41a, 41b) extending from the connector in a first direction (54) being a longitudinal direction of the flexible substrate, and a transverse side portion (41c) extending from the at least one side portion in a second direction substantially perpendicular to the first direction, and including multiple solderable second electrodes (44b), the second body formed in a band-like form to surround the first body. In the flexible substrate, the first body and the second body are joined to each other at least in a region to which the connector is to be connected, or near the aforementioned region (103, 113), and a formation region of the multiple first electrodes and a formation region of the multiple second electrodes are at approximately the same positions in the second direction.

Here, concerning the mounting conditions for fixing by soldering, it is important that the positional relationship between the electrodes on the substrate of the optical transmission module and the electrodes on the flexible substrate, and the structures of the surfaces to be soldered be the same as those in the related art. In the present invention, the electrodes on the substrate of the optical transmission module and the electrodes on the flexible substrate to be connected to them have exactly the same positional relationship as in the case of the flexible substrate having the structure branched in the transverse direction in the related art illustrated in FIG. 2A. For this reason, the soldering conditions in the related art can be employed as they are, and therefore the conditions used until now, such as temperature conditions for a solder paste and soldering work, can be applied without any change to the present invention.

Figure 2B:
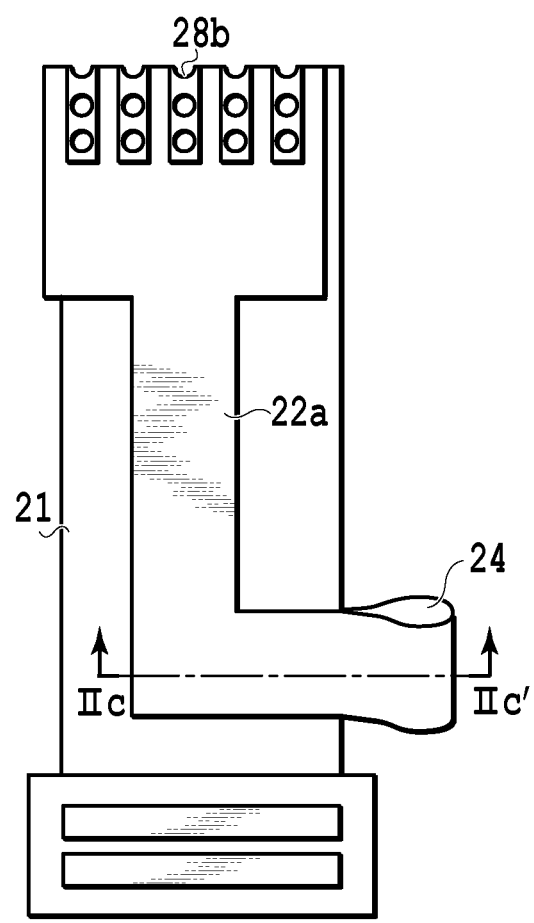
FIG. 2B is another view for explaining a folded-up state of the flexible substrate having the branch structure in the related art.
Figure 2C:
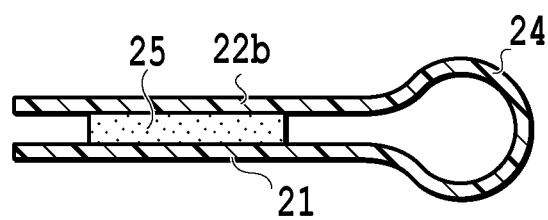
FIG. 2C is a view of a cross section of the folded-up state seen from a connector side.
Figure 3:
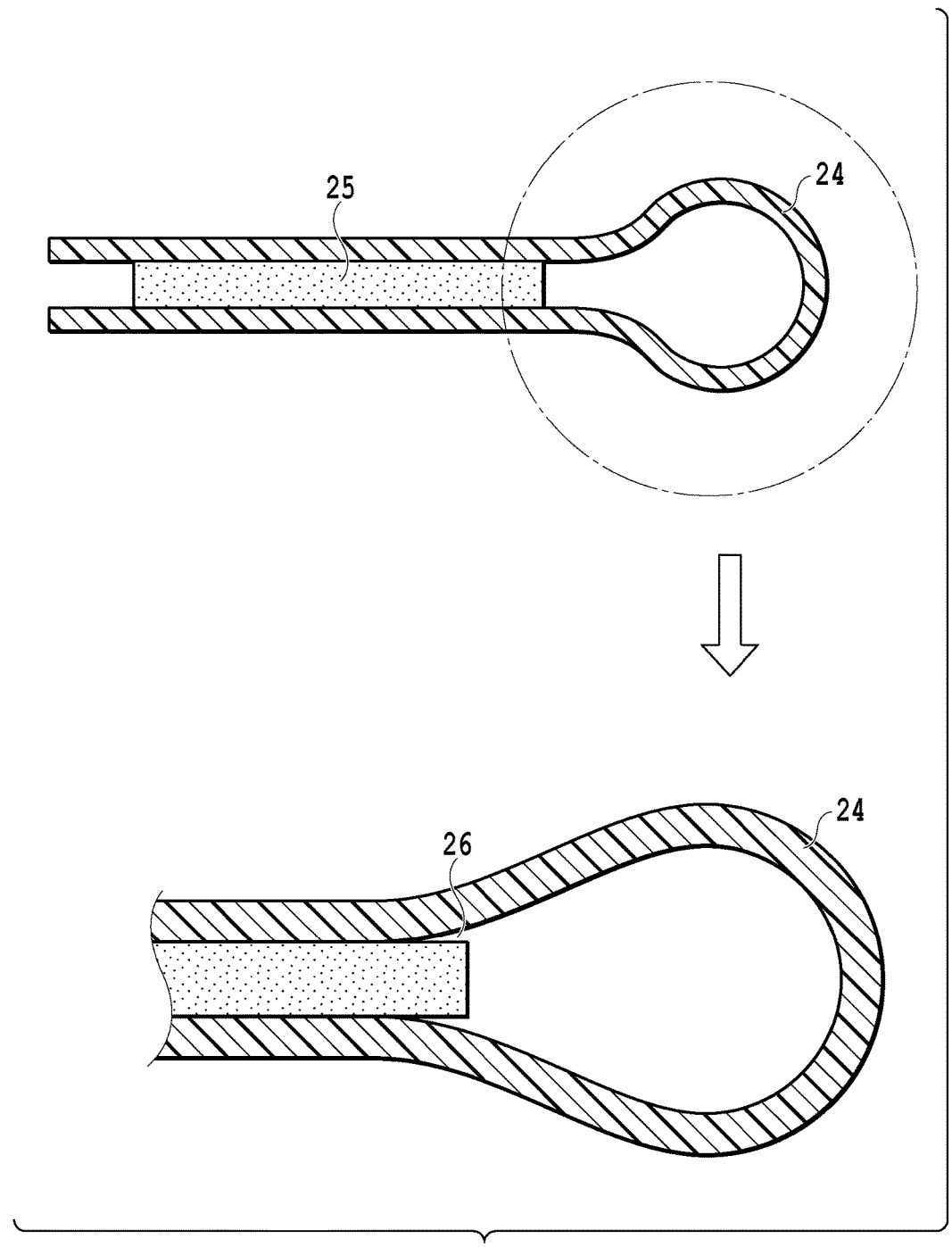
FIG. 3 is a view for explaining deterioration in a bonded portion of the flexible substrate having the branch structure in the related art.

As described above, the flexible substrate in the related art has a long-term problem of peeling off the double-sided tape in the bonding region 25 in FIG. 2A. In addition, there is a short-term problem in that, in the soldering process, the peel stress due to the stiffness of the flexible substrate concentrates only at the end electrode located closest to the curve portion 24 in FIG. 2B. In the flexible substrate in the present invention, it is unnecessary from the beginning to form the curve portion 24 by folding the body with a small radius of curvature, and fixing the body with a double-sided tape or the like. Accordingly, in the flexible substrate in the present invention fixed in the mounted state illustrated in FIG. 5, an unfolding force (stress) generated at the corner portion 46 due to the stiffness of the flexible substrate is much weaker than in the related art. Moreover, the stress does not concentrate at one electrode as in the related art, but is evenly distributed to all the electrodes among the multiple electrodes in the present invention. In addition, as presented by an arrow 54 in FIG. 5, the flexible substrate in the present invention has a structure in which the stress is applied in the longitudinal direction 54 of each of the multiple electrodes. This structure is less likely to cause the displacement and the peeling due to reheating of the flexible substrate already soldered than a structural example in which the stress in the widthwise direction of each of the multiple electrodes is applied to one electrode in a concentrated manner as in the flexible substrate in the related art illustrated in FIGS. 2A to 2C. As a matter of course, since the flexible substrate in the present invention does not involve a working step using the double-sided tape or the like, it is possible to simplify the process of soldering the flexible substrate to the optical transmission module and the process of assembling into the device, and thereby to reduce the cost in the device manufacturing process.

Figure 6:
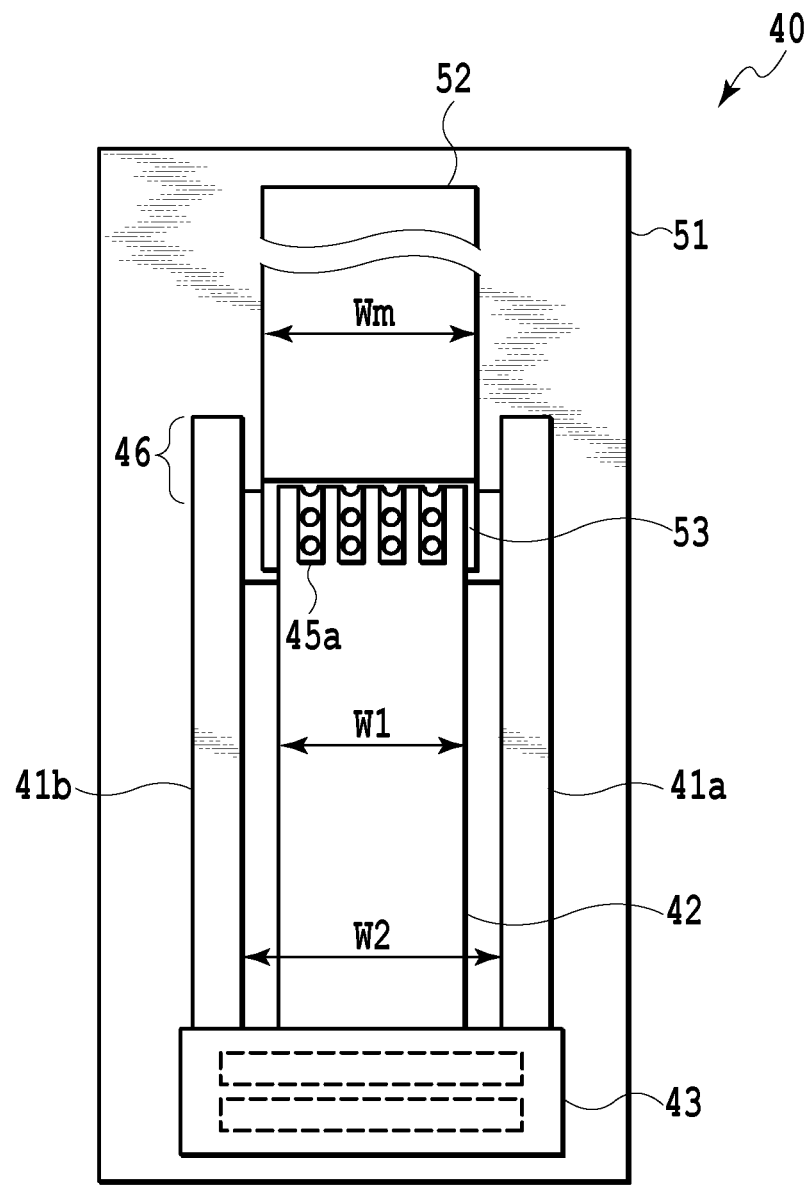
FIG. 6 is a view of a state where an optical transmission module connected with the flexible substrate in the present invention is mounted on a device substrate.

FIG. 6 is an upper side view of a state where an optical transmission module equipped with the flexible substrate in Embodiment 1 of the present invention is mounted on a device substrate. This is an upper side view of a state where the optical transmission module 52 is placed on the device substrate 51, and the terrace-like substrate 53 is viewed behind the first body 42. In the view of the mounted state in FIG. 6, the second body is seen partly which is in the band-like form including the three side portions (41a, 41b, 41c) and has the approximately squared-U or U shape. Specifically, the second body includes the two parallel side portions 41a, 41b extending from the connector 43 in the longitudinal direction of the whole flexible substrate. Moreover, the second body further includes the transverse side portion 41c on the tip end side of the corner portions 46 of the two side portions 41a, 41b, although the transverse side portion 41c is not seen because it is located behind the terrace-like substrate 53. As illustrated in FIG. 6, the width Wm of the optical transmission module 52 is between the width W1 of the first body and the width W2 of the inner space of the second body, and the size of the flexible substrate may be determined to satisfy the relationship of W1<Wm<W2 as described above.

Also from the viewpoint of manufacturing of flexible substrates per se, the flexible substrate in the present invention illustrated in FIGS. 4A and 4B is superior to the flexible substrate in the related art in light of the material utilization efficiency of a substrate. In the structure in the related art illustrated in FIG. 2A in which the second body is branched in the transverse direction, the flexible substrate as a whole spreads over a wide range. Accordingly, the total area of portions used in the substrate material is very large, and many portions in the substrate material are unused and wasted. On the other hand, the flexible substrate in the present invention illustrated in FIGS. 4A and 4B has the structure in which the first body 42 is surrounded by and thus located inside the second body 41, and accordingly portions used in the substrate material are concentrated and confined in a very compact area. Accordingly, in the manufacturing of flexible substrates per se, when individual flexible substrates are formed from a master substrate with even the same size, a waste of unused portions in the master substrate is smaller, which makes it possible to improve the utilization rate of the material and achieve cost reduction. In general, the flexible substrate manufacturing includes: laying out multiple flexible substrates within the plane of a master substrate with a large size; collectively forming multilayer structures including wiring patterns; and finally cutting the master substrate into the individual flexible substrates. Requiring only a small area, the flexible substrate in the present invention enables a larger number of the flexible substrates to be laid out on a master substrate having the same area, and therefore achieves significantly higher material utilization efficiency of the substrate and further cost reduction than in the related art.

The shape of the flexible substrate in the structure illustrated in FIGS. 4A and 4B is just one example, and may be modified in various ways. In the case of an optical transmission module, it is preferable that the first body 42 be used for high-frequency wiring (RF: radio frequency) because the first body 42 is smaller and accordingly forms shorter wiring in the flexible substrate, whereas the second body be used for low-frequency wiring including direct current (DC) wiring, the second body having a shape in a band-like form including two side portions surrounding the first body and extending longer in the longitudinal direction of the whole flexible substrate. The shapes of the two bodies can be modified in various ways, and modification examples thereof will be described in Embodiment 2 presented next.

Embodiment 2

Figure 7A:
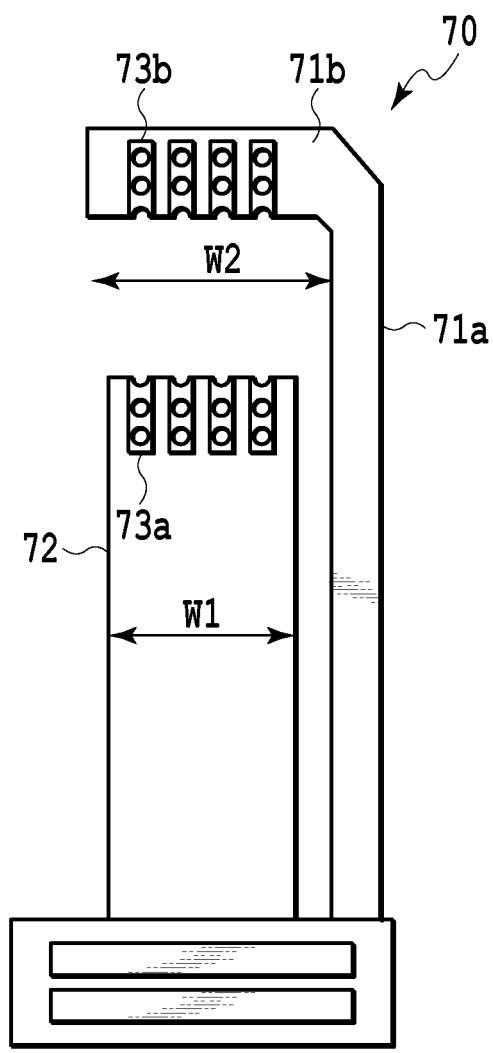
FIG. 7A is a view of a structure of Modification Example 1 of a flexible substrate in Embodiment 2.
Figure 7B:
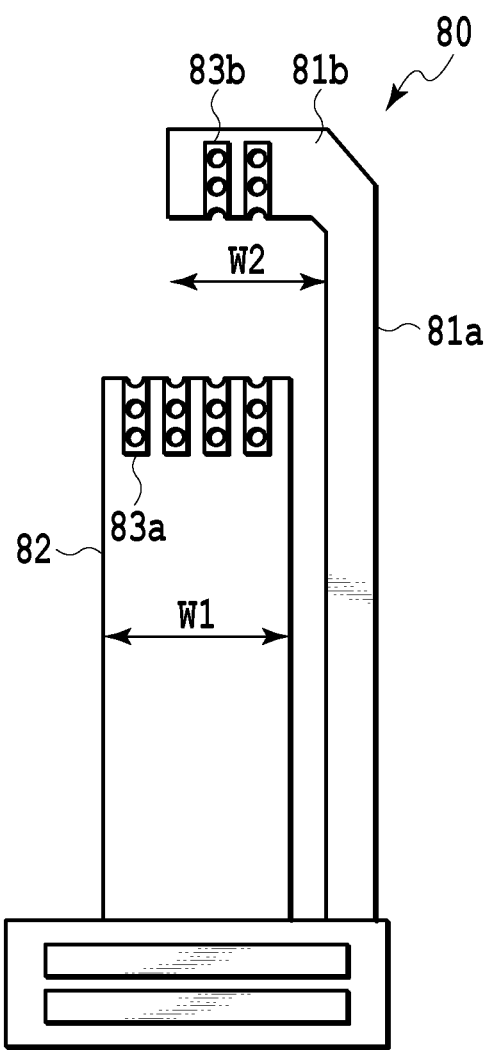
FIG. 7B is a view of a structure of Modification Example 2 of a flexible substrate in Embodiment 2.

FIGS. 7A and 7B are views illustrating structures of flexible substrates in Embodiment 2 of the present invention, and each present an unfolded state before folding-up. FIGS. 7A and 7B illustrate two different modification examples. The basic structure is the same as the structure of the flexible substrate in Embodiment 1 illustrated in FIGS. 4A and 4B, and only different points from those in Embodiment 1 are explained herein. A flexible substrate 70 in FIG. 7A illustrates a first modification example, and is different from the structure in Embodiment 1 only in the structure of a second body (71a and 71b). In Embodiment 1 illustrated in FIGS. 4A and 4B, the second body includes the two side portions 41a, 41b extending in parallel to the longitudinal direction of the whole flexible substrate, and the transverse side portion 41, and is formed in the closed band-like form to surround the periphery of the first body 42.

In Modification Example 1 in FIG. 7A, the second body (71a, 71b) includes one side portion 71a extending in the longitudinal direction of the whole flexible substrate 70, and a transverse side portion 71b extending from the side portion 71a, and is configured in a one-side-opened band-like form of an approximately inverted-L shape. In this way, the second body does not have to be closed as in Embodiment 1. Specifically, if the second body only includes at least one side portion 71a extending in the longitudinal direction of the flexible substrate, the second body can be folded back in the longitudinal direction such that multiple electrodes 73b can be placed at the same position as electrodes 73a of the first body with the substrate interposed in between. In the present modification example, the width W2 of the inner space of the second body (the width of the inner space of the transverse side portion 71b) is greater than the width W1 of the first body. With this structure, the second body can be unsharply curved so as to position the multiple electrode regions 73a, 73b of the two bodies on top of each other, and the multiple electrode regions 73a, 73b can be soldered to both surfaces of the substrate jutting like a terrace of the optimal transmission module.

In sum, the flexible substrate in the present invention can be obtained such that the first body has an approximately rectangular shape, and either the second body includes two side portions (41a, 41b) extending approximately in parallel along the first direction, and a transverse side portion (41c) extending from the two side portions, and has an approximately squared-U or U shape to surround the three sides of the above-mentioned rectangular shape (the structure in Embodiment 1), or the second body includes one side portion (71a) extending along the first direction, and a transverse side portion (71b) extending from the one side portion, and has an approximately L shape to surround the two sides of the above-mentioned rectangular shape.

In the flexible substrate in the present embodiment, it is also unnecessary to form a curve portion by folding the body with a small radius of curvature and using a double-sided tape or the like as in the related art. Thus, when the side portion 71a extending in the longitudinal direction of the flexible substrate is folded, the unfolding force due to the stiffness of the flexible substrate is weak, and moreover the stress is evenly distributed to all the electrodes among the multiple electrodes. Also, the flexible substrate in Modification Example 1 has the structure in which the multiple electrodes 73a, 73b are loaded with the stress in the longitudinal direction of each of the electrodes. This structure is less likely to cause the displacement and the peeling due to reheating of the flexible substrate already soldered than the structure in which only one electrode is loaded with the stress in the widthwise direction of each of the multiple electrodes as in the flexible substrate in the related art. Moreover, since the flexible substrate in the present embodiment also does not use the double-sided tape or the like, it is possible to simplify the process of soldering the flexible substrate to the optical transmission module and the process of assembling into the device, and thereby to further reduce the cost in the device assembling and manufacturing processes. From the viewpoint of manufacturing of flexible substrates per se, the present embodiment is the same as Embodiment 1 in that the material utilization efficiency in a master substrate is high and the flexible substrate can be manufactured at lower cost.

A flexible substrate 80 in Modification Example 2 illustrated in FIG. 7B is different from Modification Example 1 in FIG. 7A only in that the width W2 of a transverse side portion 81b is smaller than the width W1 of a first body 82. If the number of multiple electrodes 83b provided in the second body 81b is smaller than the number of multiple electrodes 83a in the first body 82, the width W2 of the inner space of the second body can be made narrower than the width W1 of the first body without any problem. In Modification Example 2, the effects of the present invention, which are distinctive as compared with the flexible substrate in the related art, are the same as in Modification Example 1 without any difference.

Embodiment 3

In the present embodiment, illustrated is a structural example in which the work in soldering the flexible substrates in aforementioned Embodiments of the present invention to optical transmission modules or the like is facilitated to be more efficiently carried out. In the flexible substrate in the present invention, the structure in which the second body is unsharply folded in the longitudinal direction of the whole flexible substrate significantly reduces the peel stress due to the stiffness of the folded portion in the soldering process of the two bodies. However, the soldering step of the second body involving reheating needs cautions on the work for minimizing the aforementioned stress. In the present embodiment, illustrated is the structural example that reduces the stress which is applied during the work in the soldering process due to variations in skill among workers.

Figure 8A:
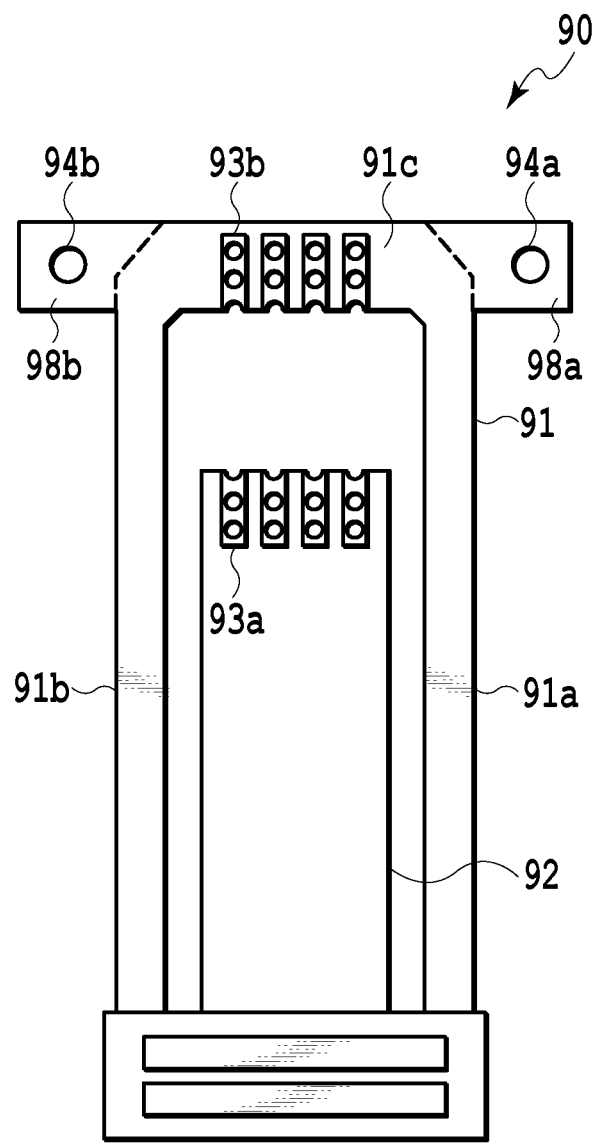
FIG. 8A is a view of a structure of a flexible substrate in Embodiment 3 of the present invention.
Figure 8B:
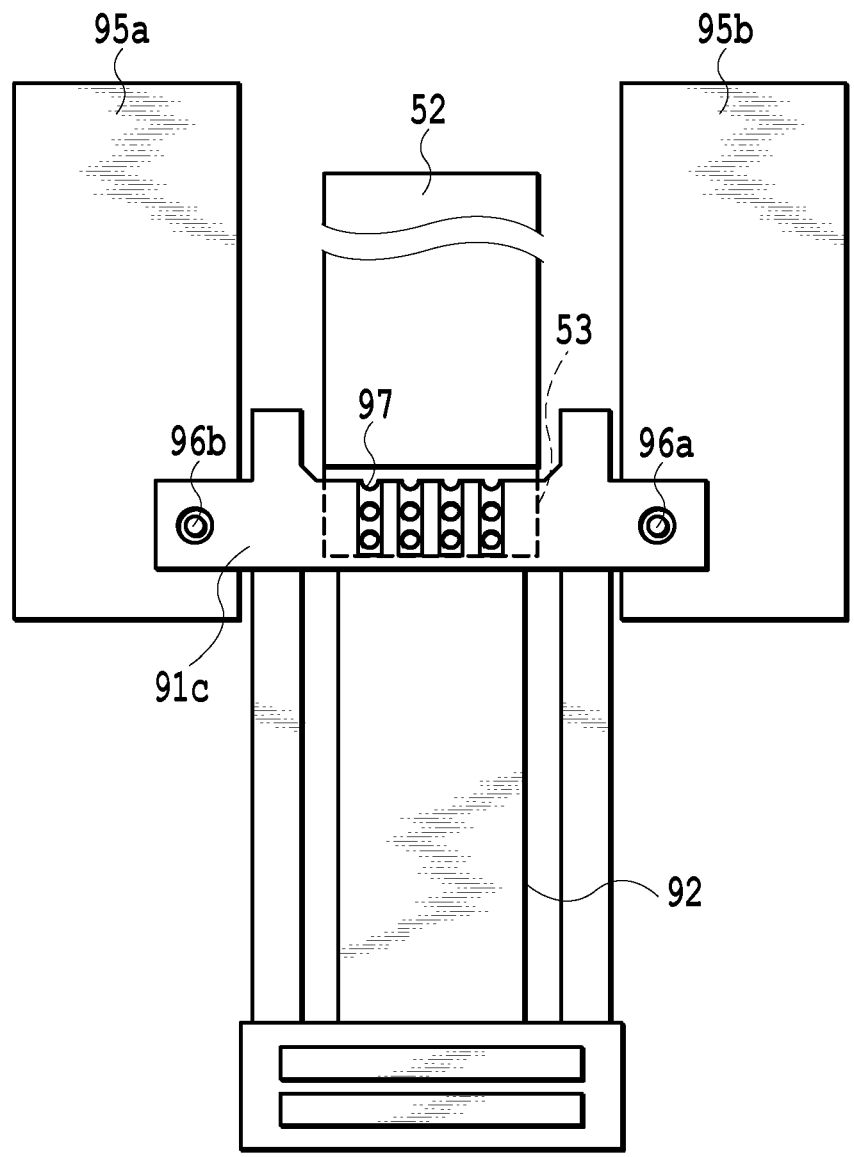
FIG. 8B is a view for explaining a method of mounting the flexible substrate in Embodiment 3.

FIGS. 8A and 8B are views for explaining a structure of a flexible substrate in Embodiment 3 of the present invention and a mounting method thereof. FIG. 8A illustrates a structure of a flexible substrate 90 in an unfolded state. The flexible substrate 90 in the present embodiment is different from the structure in Embodiment 1 in that extended portions 98a, 98b are provided on both sides of a transverse side portion 91c of a second body, and the extended portions 98a, 98b include alignment holes 94a, 94b, respectively. The other structure is the same as the structure of the flexible substrate illustrated in FIGS. 4A and 4B, and the detailed explanation thereof is omitted herein.

FIG. 8B is a view for explaining a positioning step within the soldering process of the flexible substrate in the present embodiment. FIG. 8B illustrates a state of the flexible substrate 90 in the present embodiment after the soldering of the first body 92 is completed and before the second body is soldered to the terrace-like substrate 53 of the optical transmission module 52. Here, it should be noted that the optical transmission module is not yet attached to the device substrate or the like, and the position and the orientation of the optical transmission module can be adjusted freely in order to perform the work for the second body. Thus, a state in which the folded-back second body is seen in FIG. 8B is a state in which the optical transmission module with the first body seen as illustrated in FIG. 6 is turned upside down as a whole, and is viewed from the back side. In FIG. 8B, jigs 95a, 95b for use to solder the second body are provided. The jigs 95a, 95b include alignment pins 96a, 96b, respectively. The second body and the substrate 53 of the optical transmission module can be positioned accurately in a calibrated state by folding back the second body, and then fitting the alignment holes 94a, 94b to the alignment pins 96a, 96b, respectively.

Although not illustrated in FIG. 8B, a guide mechanism with which the outline of the optical transmission module 52 turned upside-down can keep certain positional relationships with the jigs 95a, 95b and the pins 96a, 96b may be provided in addition to the jigs 95a, 95b. Use of such positioning mechanism and the alignment holes 94a, 94b of the flexible substrate makes it possible to perform a positioning step easily for a short period of time, instead of conventionally carrying out such positioning step with a visual inspection or an expensive image recognition apparatus. The extended portions (ear shape) 98a, 98b in which the alignment holes 94a, 94b are provided may be left as they are if the following mounting steps do not have any trouble. If the extended portions (ear shape) interfere with surrounding components or the like in the following mounting of the optical transmission module, the extended portions (ear shape) may be cut off by a nipper or a special jig. The structural example of the flexible substrate illustrated in FIG. 8A illustrates one in which the two alignment holes are provided in the extended portions 98a, 98b outside the two side portions 91a, 91b parallel to the longitudinal direction in the second body. However, this structure is a non-limiting example, and only one extended portion may be provided at an end portion of any of the two side portions 91a, 91b. Alternatively, an alignment hole may be provided around a corner at which the transverse side portion 91c extends from any of the two side portions 91a, 91b parallel to the longitudinal direction, as far as that structure does not cause any interference with a substrate to be soldered. Since the wiring extending from the connector through the second body may be provided to only one of the two side portions 91a, 91b parallel to the longitudinal direction, it is not always necessary to provide the extended portions 98a, 98b outside the side portions 91a, 91b.

It should be noted that the present invention also has an aspect as the invention of a method of mounting the flexible substrates in FIGS. 4A, 4B, 7A, 7B, 8A, and 8B and their modifications, although the details of the method are not repeatedly explained herein. In short, the method includes at least steps of: soldering a first body to one of surfaces of a printed substrate; and shaping a second body by folding back and soldering the second body to the opposite surface from the one surface. The aforementioned shaping step includes a step of positioning multiple electrodes of the second body on top of electrodes on the surface of the printed substrate, in which jigs for positioning as illustrated in FIGS. 8A and 8B are used.

Embodiment 4

Figure 9A:
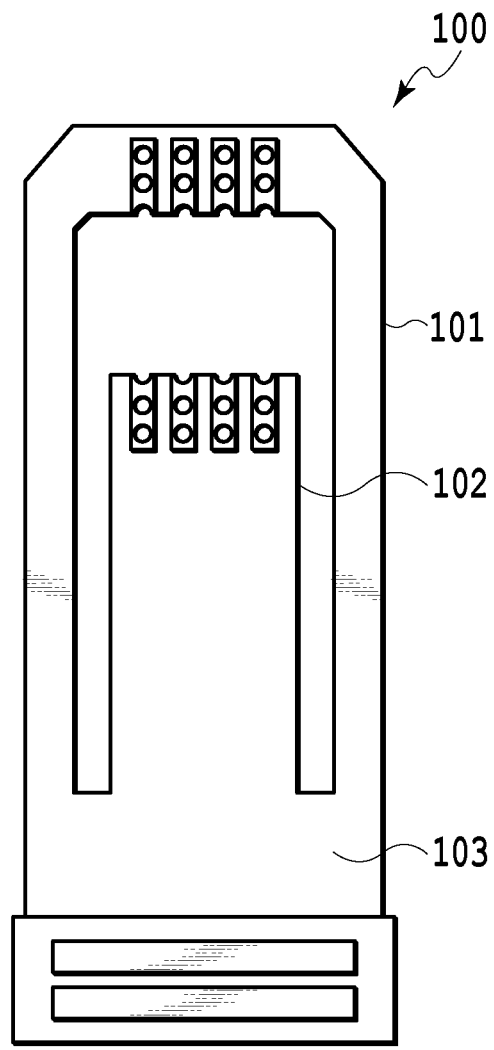
FIG. 9A is a view of a structure of a flexible substrate in Embodiment 4 of the present invention.
Figure 9B:
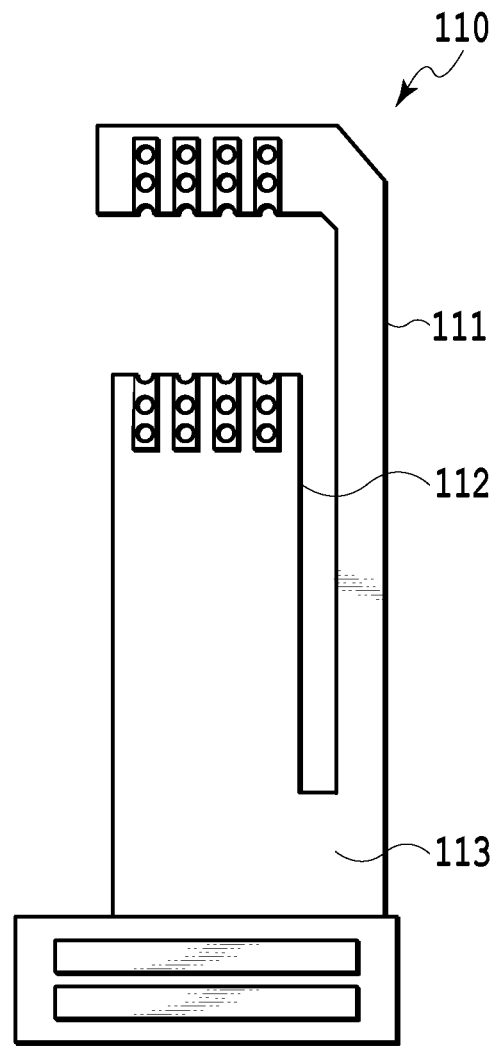
FIG. 9B is a view of another structure of a flexible substrate in Embodiment 4 of the present invention.

FIGS. 9A and 9B are views illustrating structures of flexible substrates in Embodiment 4 of the present invention. All of Embodiments 1 to 3 are described such that the first body and the second body are joined to each other inside the connector. Separate bodies may be connected mechanically in the connector, but it is usual practice that these bodies are already formed as a single body via a common portion (merge portion) in a stage before the connector is attached thereto. The first body and the second body may be united outside the connector, as far as the flexible substrate can be mounted with the second body folded in the longitudinal direction of the whole flexible substrate as illustrated in FIG. 5 and so on. Thus, as in a flexible substrate 100 in FIG. 9A, two bodies 101, 102 may be united continuously via a continuous portion 103 located outside a connector and near the connector. Similarly, as in a flexible substrate 110 in FIG. 9B, two bodies 111, 112 may be united continuously via a continuous portion 113 located outside and near a connector. In either case, the two bodies may be joined or connected in any manner, as far as the two bodies can be handled without any trouble in the soldering work of the two bodies, so that excessive stress does not occur when the second body 101, 111 is folded in the longitudinal direction of the whole flexible substrate.

Hereinabove, the flexible substrates in the present invention have been described. In any of Embodiments, the flexible substrate can be easily soldered to both surfaces of the terrace-like substrate at the end portion of the optical transmission module in such a way that the second body having the shape to surround the periphery of the first body is unsharply folded back (folded up) in the longitudinal direction of the whole flexible substrate. The peel stress is evenly applied to all the multiple electrodes provided to the end portion of each of the bodies on the opposite side from the connector, and the stress does not concentrate at only one electrode. Moreover, since the aforementioned stress is applied along the long sides of the electrode shape of each of the multiple electrodes, the flexible substrate has higher peel resistance of the electrodes. Even in the case where a reheating step is indispensable because the steps of connecting the two bodies of the flexible substrate one by one are involved, the flexible substrate is less likely to cause a displacement of soldered electrodes of the flexible substrate, or a deformation or damage of the joint portion, and therefore is capable of suppressing deterioration in the high-frequency characteristics, a reduction in the yield of the optical transmission modules, and the like.

All of Embodiments are described such that the internal layer in the first body includes the high-frequency signal wiring, and the internal layer in the second body surrounding the periphery of the first body includes the DC wiring or the like, but the flexible substrates are not limited to this usage. In other words, the first body may include DC wiring, whereas the second body may include signal wiring.

Depending on the number or usage of electric signals to be used, and frequencies to be used in an optical transmission module or a device, signal wiring and other wiring may be allocated appropriately, and there is no obstacle to include signal wiring other than the DC wiring. Moreover, the profile of the first body is described as a rectangular shape, but will not have any problem even if it employs a shape other than the rectangular shape. The shape of the second body is not limited to a square-U shape, a U shape, or an inverted-L shape, but may be any shape as far as the flexible substrate can be easily soldered to both surfaces of a module, a device, or the like with the second body folded back unsharply along the longitudinal direction of the flexible substrate viewed on the whole.

As described in details, according to the flexible substrate in the present invention, it is possible to provide a flexible substrate that attains a compact folded-up structure with high reliability, and is prevented from causing displacement of electrodes in a soldered joint portion or deformation or damage of the joint portion, which otherwise may occur during the work of mounting the flexible substrate.

INDUSTRIAL APPLICABILITY

The present invention is applicable to an optical communication system. In particular, the present invention is applicable to an optical transmission module of an optical communication system.

The invention claimed is:

1. A flexible substrate having a branch structure, the flexible substrate comprising:
a connector;
a first body containing first electric wiring connected to the connector, and including a plurality of solderable first electrodes; and
a second body containing second electric wiring connected to the connector, and including
at least one side portion which extends from the connector in a first direction being a longitudinal direction of the flexible substrate, and
a transverse side portion which extends from the at least one side portion in a second direction being approximately perpendicular to the first direction, and which includes a plurality of solderable second electrodes, the second body formed in a band-like form to surround the first body, wherein
the first body and the second body are joined together at least in or near a region to which the connector is connected, and
a formation region of the plurality of first electrodes and a formation region of the plurality of second electrodes are located at approximately the same positions in the second direction.

2. The flexible substrate according to claim 1, wherein the first body has an approximately rectangular shape, the second body
which includes two side portions extending approximately in parallel along the first direction, and a transverse side portion extending from the two side portions, and which has an approximately squared-U or U shape to surround three sides of the rectangular shape, or
which includes one side portion extending along the first direction, and a transverse side portion extending from the one side portion, and which has an approximately L shape to surround two sides of the rectangular shape.

3. The flexible substrate according to claim 2, wherein at least one of two end portions of the transverse side portion includes a part that fixes a position of the plurality of second electrodes of the second body relative to the first body.

4. The flexible substrate according to claim 3, wherein when the transverse side portion of the second body is folded in the first direction, the formation region of the plurality of first electrodes and the formation region of the plurality of second electrodes are placed on top of each other.

5. The flexible substrate according to claim 4, wherein the first electric wiring is high-frequency electric signal wiring, and the second electric wiring is power supply wiring.

6. The flexible substrate according to claim 5, wherein each of the plurality of first electrodes and the plurality of second electrodes includes a through hole or a blind hole.

7. An optical transmission module comprising a terrace in which electric wiring is formed, wherein
the plurality of first electrodes of the flexible substrate according to claim 6 are fixed to one surface of the terrace, and
the plurality of second electrodes of the flexible substrate according to claim 6 are fixed to an opposite surface of the terrace.

8. The flexible substrate according to claim 4, wherein each of the plurality of first electrodes and the plurality of second electrodes includes a through hole or a blind hole.

9. The flexible substrate according to claim 2, wherein when the transverse side portion of the second body is folded in the first direction, the formation region of the plurality of first electrodes and the formation region of the plurality of second electrodes are placed on top of each other.

10. The flexible substrate according to claim 9, wherein the first electric wiring is high-frequency electric signal wiring, and
the second electric wiring is power supply wiring.

11. The flexible substrate according to claim 10, wherein each of the plurality of first electrodes and the plurality of second electrodes includes a through hole or a blind hole.

12. An optical transmission module comprising a terrace in which electric wiring is formed, wherein
the plurality of first electrodes of the flexible substrate according to claim 11 are fixed to one surface of the terrace, and
the plurality of second electrodes of the flexible substrate according to claim 11 are fixed to an opposite surface of the terrace.

13. The flexible substrate according to claim 9, wherein each of the plurality of first electrodes and the plurality of second electrodes includes a through hole or a blind hole.

14. The flexible substrate according to claim 1, wherein at least one of two end portions of the transverse side portion includes a part that fixes a position of the plurality of second electrodes of the second body relative to the first body.

15. The flexible substrate according to claim 14, wherein when the transverse side portion of the second body is folded in the first direction, the formation region of the plurality of first electrodes and the formation region of the plurality of second electrodes are placed on top of each other.

16. The flexible substrate according to claim 15, wherein the first electric wiring is high-frequency electric signal wiring, and
the second electric wiring is power supply wiring.

17. The flexible substrate according to claim 1, wherein when the transverse side portion of the second body is folded in the first direction, the formation region of the plurality of first electrodes and the formation region of the plurality of second electrodes are placed on top of each other.

18. The flexible substrate according to claim 17, wherein the first electric wiring is high-frequency electric signal wiring, and
the second electric wiring is power supply wiring.

19. A method of mounting a flexible substrate having a branch structure onto a terrace-like substrate jutting from one end of an optical transmission module, wherein
the flexible substrate includes: a connector; a first body containing first electric wiring connected to the connector, and including a plurality of solderable first electrodes; and a second body containing second electric wiring connected to the connector, and including at least one side portion which extends from the connector in a first direction being a longitudinal direction of the flexible substrate, and a transverse side portion which extends from the at least one side portion in a second direction being approximately perpendicular to the first direction, and which includes a plurality of solderable second electrodes,
the second body is formed in a band-like form to surround the first body,
the first body and the second body are joined together at least in or near a region to which the connector is connected, and
a formation region of the plurality of first electrodes and a formation region of the plurality of second electrodes are located at approximately the same positions in the second direction, and
the method comprises the steps of:
soldering the plurality of first electrodes of the first body to electrodes provided on one surface of the terrace-like substrate;
folding back the second body at an intermediate part of the at least one side portion toward the connector, and shaping the second body such that the second electrodes and electrodes provided on an opposite surface of the terrace-like substrate are located at the same position; and
soldering the plurality of second electrodes of the second body to the electrodes on the opposite surface of the terrace-like substrate.

* * * * *